United States Patent [19]

Itoh

[11] Patent Number: 5,396,947
[45] Date of Patent: Mar. 14, 1995

[54] RADIATING DEVICE
[75] Inventor: Akira Itoh, Osaka, Japan
[73] Assignee: Itoh Research & Development Laboratory Co., Ltd, Osaka, Japan
[21] Appl. No.: 25,030
[22] Filed: Mar. 1, 1993
[30] Foreign Application Priority Data
  Mar. 3, 1992 [JP] Japan .................................. 4-045781
[51] Int. Cl.6 .............................................. H05K 7/20
[52] U.S. Cl. ............................ 165/104.14; 165/104.33; 29/890.032
[58] Field of Search ....................... 165/104.14, 104.33; 29/890.032

[56] References Cited
U.S. PATENT DOCUMENTS
4,482,242  5/1984  Andres et al. .................. 165/104.14

FOREIGN PATENT DOCUMENTS
75639   5/1983  Japan ............................. 165/104.14
264296 10/1989  Japan ............................. 165/104.14

Primary Examiner—John K. Ford
Attorney, Agent, or Firm—W. G. Fasse; W. F. Fasse

[57] ABSTRACT

A radiating device 10 includes a radiating plate 11 having a flat bottom surface 12 serving as a heat receiving surface, a top surface 13, and a column 14. Column 14 includes a protruding base portion 15 integrally connected to top surface 13 of radiating plate 11 and extending so as to protrude upward, a pipe 16 inserted into a hole of protruding base portion 15, a fin 19 secured to the upper portion of pipe 16 and a working fluid 17 serving as head carrier introduced into pipe 16.

13 Claims, 8 Drawing Sheets (a)

(b)

(c)

PRIOR ART

RADIATING DEVICE

BACKGROUND OF THE INVENTION

1. Field of the Invention

The present invention relates to a radiating device for radiating heat of an electronic component such as a semiconductor integrated circuit package to the atmosphere.

2. Description of the Background Art

Recently, higher responsiveness and higher integration of integrated circuits used for electronic devices such as computers have been in greater demand. Accordingly, density of power consumption of an integrated circuit has been increased, and the operating temperature of the electronic component has been increased. In order to cool the electronic component, a radiating device such as a heat sink has been used.

FIG. 11 shows a conventional radiating device 2 placed on a semiconductor integrated circuit package 1. Radiating device 2 includes a thin rectangular base plate 3 which is in surface-contact with the top surface of semiconductor integrated circuit package 1, and a number of pins 4 erected on the top surface of base plate 3 so as to increase the surface area of the radiating device. Typically, radiating device 2 is formed of aluminum. The heat of semiconductor integrated circuit package 1 is transmitted to radiating device 2, and is radiated to the atmosphere from the surface of radiating device 2.

FIG. 12 shows a conventional fin type radiating device 5. Radiating device 5 includes a circular base plate 6 which is in surface-contact with the top surface of the semiconductor integrated circuit package, and a plurality of fins 7 erected on the top surface of base plate 6 so as to increase the surface area of the radiating device. Typically, radiating device 5 of this type is also formed of aluminum.

In the conventional radiating device such as shown in FIGS. 11 and 12, radiating effect is improved by increasing the surface area. However, such conventional radiating devices not provide satisfactory cooling results when used with the most modern electronic components, the higher responsiveness and higher integration of which have been much desired.

A heat pipe has been known as another example of a radiating device for cooling an electronic component. A heat pipe is obtained by reducing the inner pressure of an air tight container formed by closing both ends of a pipe, and by sealing into the pipe a little heat carrier such as water or alcohol, which is called a working fluid. At a heated portion of the heat pipe, the fluid turns into steam or gas, the gas radiates or loses heat when it moves away from the heated portion, and turns into liquid. The liquid returns to the heated portion because of capillary, for example action. The heat is transmitted from the heated portion to the radiating portion by the repetition of this phenomenon.

A heat pipe is placed on the top surface of an electronic component in order to cool the electronic component such as a semiconductor integrated circuit package. Since the heat pipe is linearly in contact with the electronic component, it is inferior in efficiency of heat transmission from the electronic component to the heat pipe.

SUMMARY OF THE INVENTION

An object of the present invention is to provide a radiating device having superior radiating characteristics to the conventional radiating devices.

Another object of the present invention is to provide a radiating device including a heat pipe with a larger area for receiving heat from the electronic component.

A further object of the present invention is to provide a radiating device having an increased surface area for radiating heat as well as having a function as a heat pipe.

According to one aspect of the present invention, the radiating device includes a radiating plate having a flat bottom surface serving as a heat receiving surface, a top surface, and at least one column extending so as to protrude upward from the top surface. The column has a passage therein for circulating gas and liquid thus serving as a heat pipe.

Since the radiating plate has at least one column extending so as to protrude upward, the surface area of the radiating plate is increased, enhancing radiating effect. The bottom surface of the radiating plate is in surface-contact with the top surface of the electronic component. Therefore, heat from the electronic component is transmitted with high efficiency to the radiating plate. By the heat transmitted from the electronic component, the radiating plate as a whole is heated. The passage for circulating gas and liquid serving as a heat pipe is formed within the column of the radiating plate, and therefore the inner wall surface defining the passage is entirely heated. The working fluid sealed in the passage repeats evaporation and condensation frequently. Liquid condensed at the radiating portion returns to the heated portion through the inner wall surface defining the passage. According to the present invention, a radiating device having a heat pipe structure with superior efficiency of heat reception and superior radiating characteristics can be provided.

In order to enhance the radiating effect, a plurality of columns are preferably formed in a matrix.

In one embodiment, the column includes a protruding base portion, a pipe, and a working fluid. The protruding base portion is integrally connected to the top surface of the radiating plate and extends so as to protrude upward. In the protruding base portion, a hole extending from the upper end surface to the vicinity of the bottom surface of the radiating plate is formed. The pipe has its lower portion inserted into the hole of the protruding base portion and its upper portion further protruding upward above the upper end portion of the protruding base portion. The pipe is tight-sealed. The working fluid is the heat carrier introduced into the tight-sealed pipe.

In a preferred embodiment, the column includes a plurality of fins attached to the upper portion of the pipe in order to provide superior radiating characteristics.

In another embodiment of the present invention, the column extends at an angle inclining to the bottom surface of the radiating plate. In an example for implementing this, the top surface of the radiating plate has an inclining surface extending at an angle inclining to the bottom surface, and the column extends so as to protrude from the inclining surface. By forming the column so as to extend at an angle inclining to the bottom surface of the radiating plate, the passage serving as a heat pipe can be positioned so as to incline downward from the radiating portion to the heated portion regardless of how the radiating device is placed on the electronic component. For example, even if the bottom surface of the radiating plate serving as a heat receiving surface is vertically positioned, the radiating portion of the heat pipe can be positioned above the heated portion thereof. Therefore, liquid condensed at the radiating portion smoothly returns to the heated portion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS AND OF THE BEST MODE OF THE INVENTION

Figure 1:
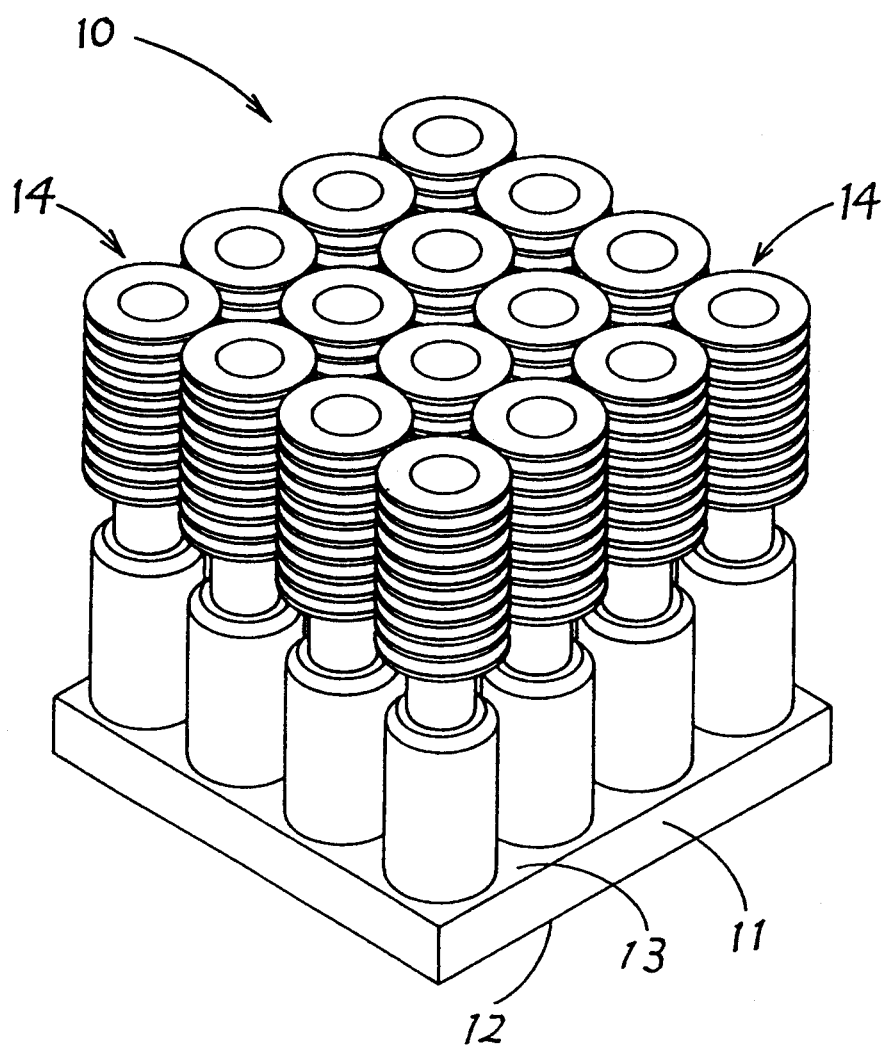
FIG. 1 is a perspective view showing one embodiment of the present invention.
Figure 2:
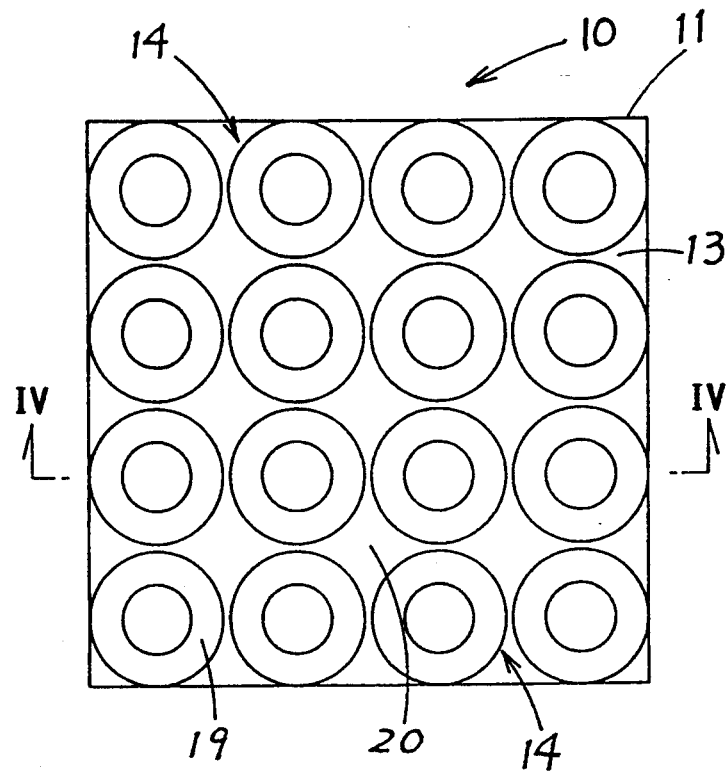
FIG. 2 is a plan view of the radiating device shown in FIG. 1.
Figure 3:
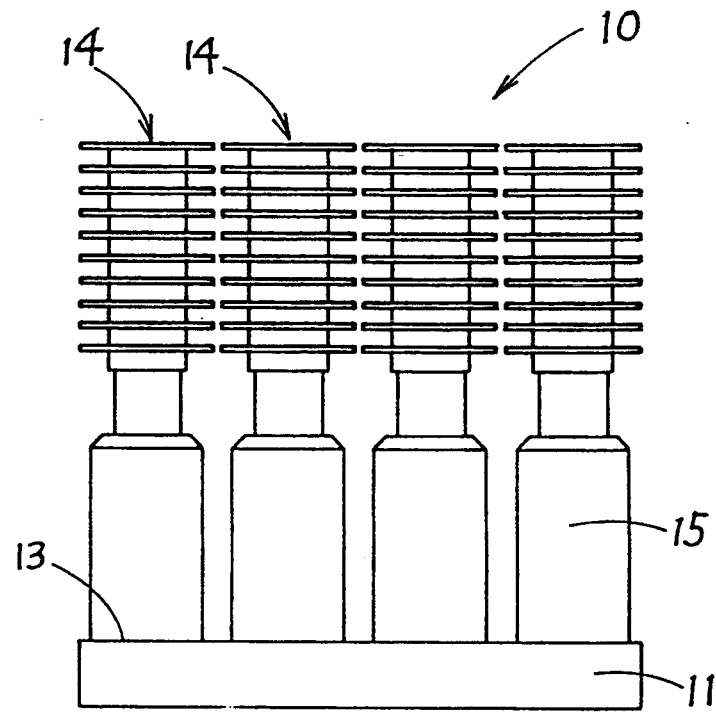
FIG. 3 is a front view of the radiating device shown in FIG. 1.

A radiating device 10 in accordance with one embodiment of the present invention shown in FIGS. 1 to 3 includes a radiating plate 11 formed of aluminum. Radiating plate 11 includes a bottom surface 12, a top surface 13, and a column 14 extending so as to protrude upward from top surface 13. Bottom surface 12 of radiating plate 11 serves as a heat receiving surface which is in surface-contact with an electronic component such as a semiconductor integrated circuit package. In order to improve the efficiency of heat transmission from the electronic component to radiating plate 11, bottom surface 12 of radiating plate 11 is polished so as to be sufficiently flat. As shown in FIG. 2, a plurality of columns 14 are formed in a matrix.

Figure 4:
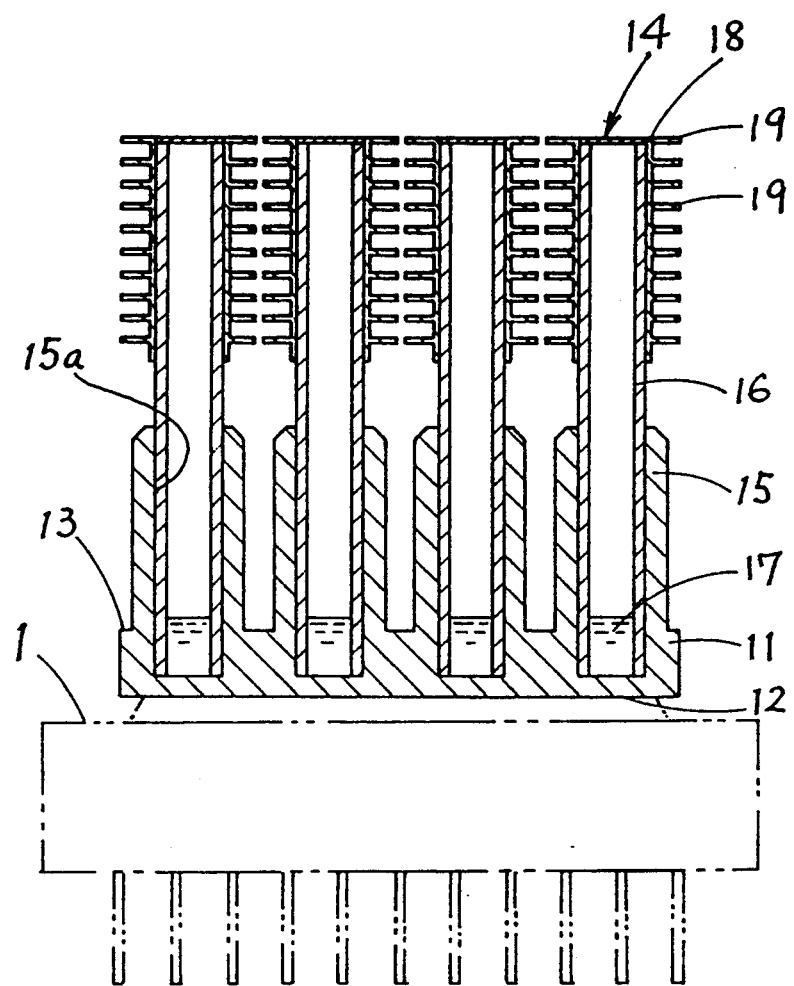
FIG. 4 is a cross section taken along the line IV—IV of FIG. 2.

Referring to FIG. 4 showing a cross section taken along the line IV—IV of FIG. 2, a specific structure of column 14 will be described. Column 14 includes a protruding base portion 15 integrally connected to top surface 13 of radiating plate 11 and extending so as to protrude upward. Protruding base portion 15 includes a hole 15a extending from the upper end surface thereof to the vicinity of bottom surface 12 of radiating plate 11. Into hole 15a of protruding base portion 15, a copper pipe 16 is inserted. The upper portion pipe 16 further protrudes upward above the upper end surface of protruding base portion 15. The upper and lower ends of pipe 16 are tight-sealed. Prior to tight-sealing pipe 16, inner pressure of the pipe is reduced, and an appropriate amount of a working fluid 17 serving as a heat carrier is introduced into the pipe. The amount of introduced working fluid 17 is about 15-18% in volume of the total volume of the space in pipe 16.

To the upper portion of pipe 16, a sleeve 18 having a plurality of fins 19 is secured. In this embodiment, a planar shape of the fin is circular.

Referring to FIG. 4, semiconductor integrated-circuit package 1 is shown by a dashed phantom line. Bottom surface 12 of radiating plate 11 is in surface-contact with the top surface of semiconductor integrated circuit package 1, and receives heat therefrom. When radiating plate 11 is not heated, working fluid 17 introduced into pipe 16 is in liquid phase, and positioned at the lower portion of pipe 16. When radiating device 10 is placed on the top surface of semiconductor integrated circuit package 1 and heated, pipe 16 is also heated by heat conduction from the inner wall surface defining hole 15a. As a result, working fluid 17 turns into steam or gas, and flows toward the upper end of pipe 16. Since a plurality of fins 19 are secured at the upper portion of pipe 16, heat is radiated to the atmosphere through these fins.

The working fluid in a gas phase radiates at the radiating portion, that is, the upper portion of pipe 16, and returns to a liquid phase. The liquid flows downward to return to the heated portion. The liquid removes heat from pipe 16 while it returns from the radiating portion to the heated portion, and again evaporates at the heated portion. By the repetition of such evaporation and condensation, the radiating effect of the radiating device is improved.

In the embodiment shown in FIGS. 1 to 4, since radiating plate 11 has protruding base portion 15, the surface area for radiating heat is large. In addition to this, the repetition of evaporation and condensation of working fluid 17 enhances radiating characteristics. Furthermore, provision of a plurality of fins at the upper portion of pipe 16 contributes to superior radiating effect.

In the embodiment shown in FIGS. 1 to 4, since a planar shape of the fin 19 is circular, a space 20 surrounded by four fins 19 adjacent to each other in one dimension is formed. Air in space 20 is heated, thereby moving upward to escape to the atmosphere. With the movement of the heated air, inner pressure of space 20 is reduced. As a result, cool air in the atmosphere enters space 20 through a gap surrounded by adjacent protruding base portions 15. By making the planar shape of fin 19 circular, air convection can be generated as described above. Radiating characteristics of radiating device 10 can be improved by the air convection.

Figure 5:
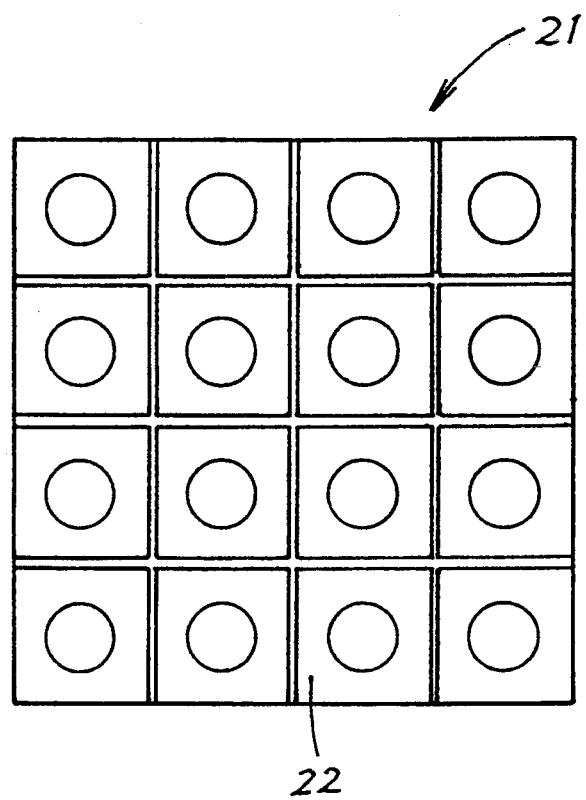
FIG. 5 is a plan view showing another embodiment of the present invention.

FIG. 5 is a plan view showing another embodiment of the present invention. A radiating device 21 shown in FIG. 5 is different from radiating device 10 shown in FIG. 1 in that a planar shape of a fin 22 is rectangular. By making the planar shape of fin 22 rectangular, area of the fin for radiating heat can be increased.

Figure 6:
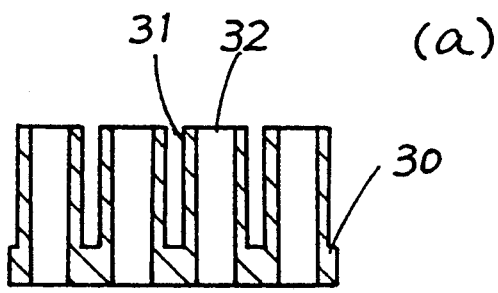
FIG. 6 is a diagram showing an example of steps in order of manufacturing the radiating device.
Figure 6:
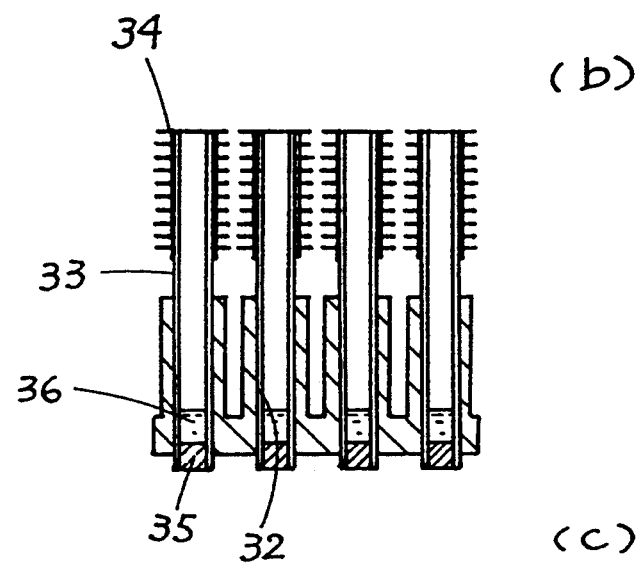
Figure 6:
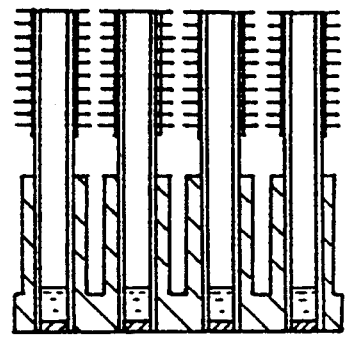

FIG. 6 shows steps of manufacturing the radiating device in order. As shown in FIG. 6 (a), a radiating plate 30 is first casted. Radiating plate 30 has a protruding portion 31. Protruding portion 31 is provided with a through hole 32.

As shown in FIG. 6 (b), a tight-sealed pipe 33 having a working fluid therein is inserted into hole 32 of radiating plate 30. The lower portion of pipe 33 is filled with a sealing member 35. To the upper portion of pipe 33, a sleeve 34 with a fin is secured. As shown in the figure, pipe 33 is tightly secured in through hole 32 of radiating plate 30 by using silver paste, with the lower portion of pipe 33 formed to protrude from the bottom surface of radiating plate 30.

As shown in FIG. 6 (c), by polishing the bottom surface of radiating plate 30, the protruding portion of pipe 33 is removed and the bottom portion of radiating plate 30 is finished to be flat.

Figure 7:
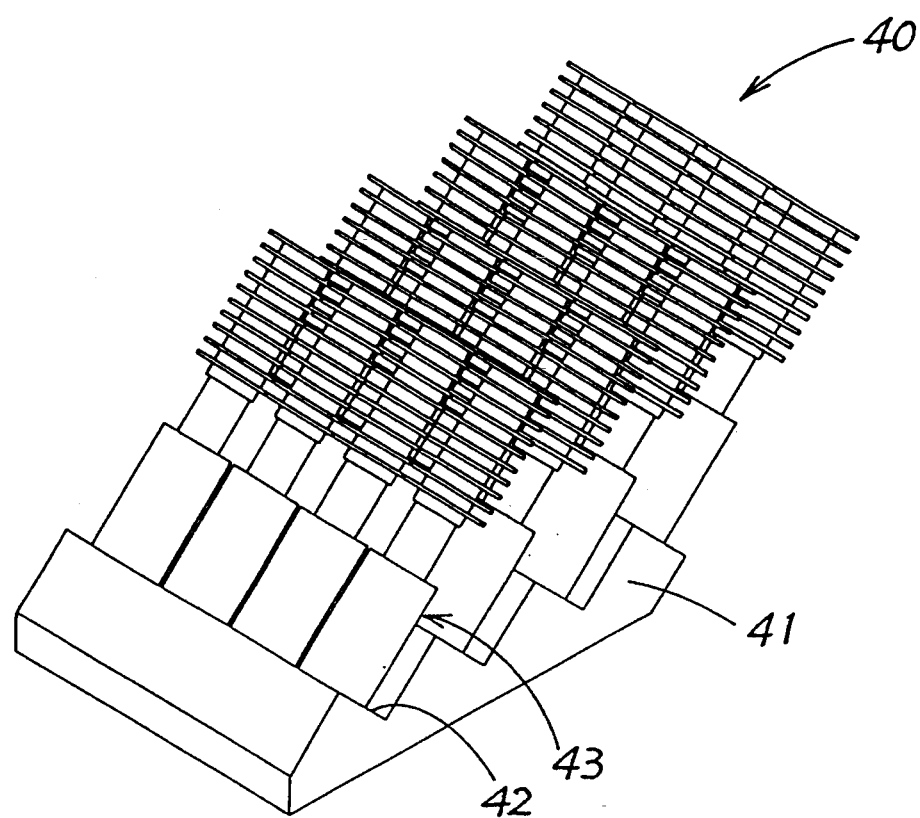
FIG. 7 is a perspective view showing still another embodiment of the present invention.
Figure 8:
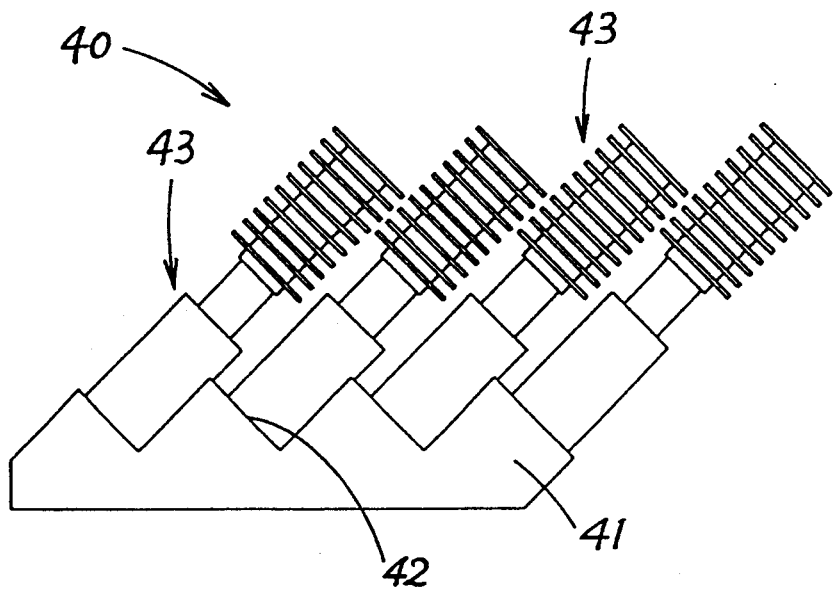
FIG. 8 is a side view of the radiating device of FIG. 7.

FIGS. 7 and 8 show a further embodiment of the present invention. A radiating device 40 includes a column 43 extending at an angle inclined relative to the bottom surface of a radiating plate 41. As shown, the top surface of a radiating plate 41 is formed in a serrated or stepped manner with inclining surfaces 42. Column 43 extends so as to protrude from inclining surface 42 of radiating plate 41.

Figure 9:
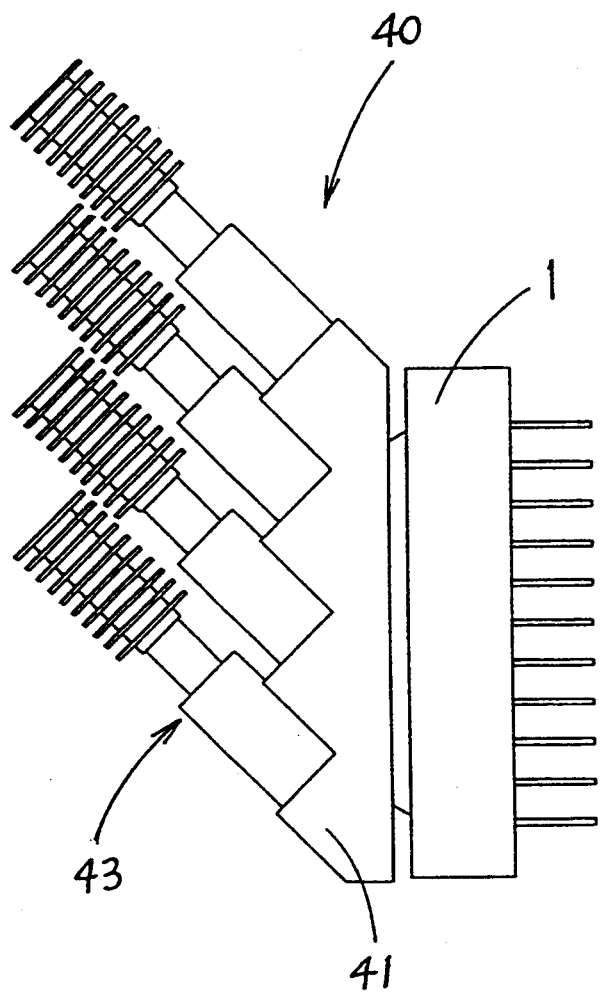
FIG. 9 is a diagram showing how the radiating device shown in FIG. 7 is attached on the semiconductor integrated circuit package.
Figure 11:
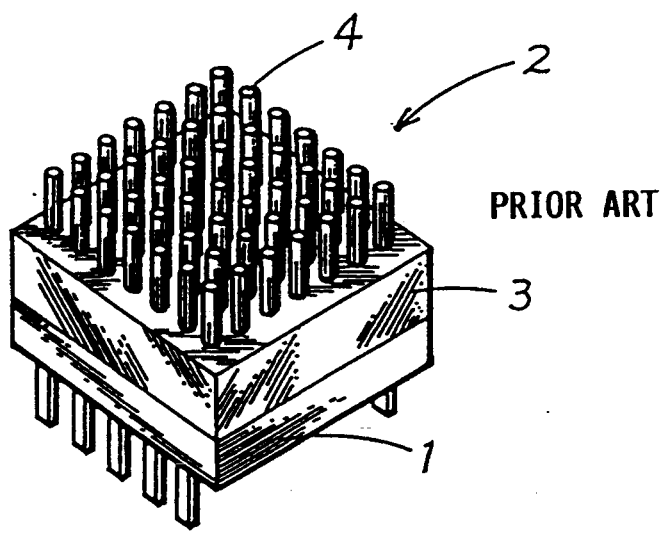
FIG. 11 is a perspective view showing an example of a conventional radiating device.
Figure 12:
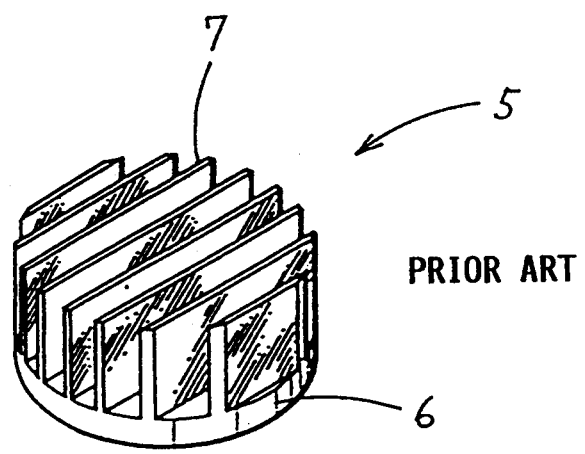
FIG. 12 is a perspective view showing another example of the conventional radiating device.

Radiating device 40 shown in FIG. 7 is configured so that a working fluid as heat carrier can repeat evaporation and condensation efficiently even if the bottom surface of the device serving as a heat receiving surface is positioned in the vertical direction. For example, as shown in FIG. 9, it is assumed that the bottom surface serving as a heat receiving surface is positioned in the vertical direction when radiating device 40 is placed on semiconductor integrated circuit package 1. Even in this case, the tip end portion of column 43 always can be maintained above the lower end thereof. Therefore, when the working fluid introduced into column 43 is condensed into liquid at the tip end portion of column 43, the liquid can return to the heated portion by gravity.

Figure 10:
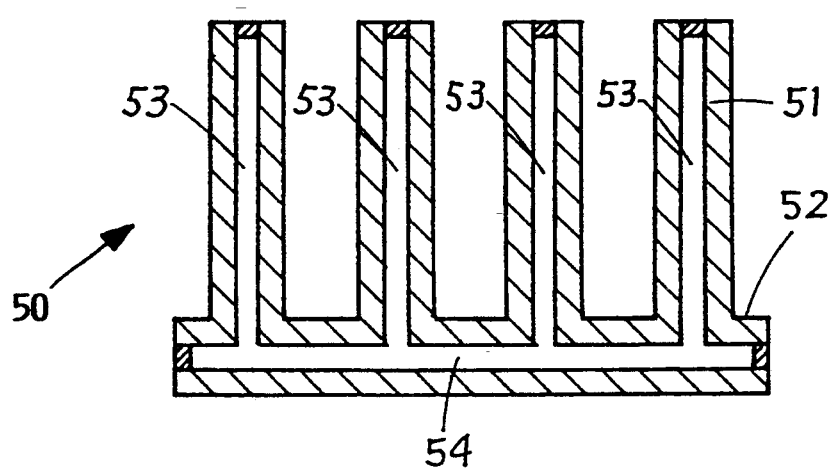
FIG. 10 is a cross section showing a further embodiment of the present invention.

FIG. 10 shows a further embodiment of the present invention. A radiating device 50 includes a radiating plate 52 having a plurality of protruding base portions 51 on the top surface. A vertical passage 53 is formed in each protruding base portion 51. As shown in the figure, respective vertical passages 53 are connected to each other through a horizontal passage 54 extending in parallel to the bottom surface of radiating plate 52. End portions of openings of passages 53, 54 are tight-sealed. An appropriate amount of a working fluid serving as a heat carrier is introduced into passages 53, 54. Unlike the aforementioned embodiment, a passage serving as a heat pipe is directly formed in radiating plate 52 in place of using a pipe in the embodiment shown in FIG. 10. Respective vertical passages 53 are communicated with each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radiating device, comprising a radiating plate having a flat bottom surface serving as a heat receiving surface, a top surface comprising an inclining surface extending at an angle inclined to the bottom surface, a plurality of columns extending so as to protrude upward from said inclining surface of the top surface at an angle inclined to the bottom surface, and a respective plurality of fins arranged on each column of said plurality of columns at a first end thereof, wherein each column of said plurality of columns has a cylindrical portion at a second end and has a passage in said column for circulating gas and liquid to serve as a heat pipe.

2. The radiating device according to claim 1, wherein said plurality of columns is arranged in a matrix on said radiating plate.

3. The radiating device according to claim 1, wherein each said column includes
   a protruding base portion integrally connected to the top surface of said radiating plate and extending so as to protrude upward, and having a hole extending from an upper end surface of said protruding base portion to the vicinity of the bottom surface of said radiating plate,
   a pipe having its lower portion inserted into the hole of said protruding base portion and its upper portion further protruding upward above the upper end surface of said base portion, and
   a working fluid as heat carrier introduced into said pipe, wherein said lower portion of said pipe and said protruding base portion together form said cylindrical portion of said column, and wherein said upper portion has said fins arranged thereon.

4. The radiating device according to claim 1, wherein each fin of said plurality of fins has a circular planar shape.

5. The radiating device according to claim 1, wherein each fin of said plurality of fins has a rectangular planar shape.

6. The radiating device according to claim 1, wherein each fin of said plurality of fins is arranged to extend on a respective plane substantially perpendicular to a direction of said extending of said column.

7. The radiating device according to claim 1, wherein said column defines an enclosed space and contains a working fluid of about 15% to about 18% of the volume of said enclosed space.

8. A radiating device comprising a radiating plate having a flat bottom surface serving as a heat receiving surface and a top surface inclined at an angle to the bottom surface, said device further comprising a heat pipe column having a fluid flow passage therein, said column extending from the top surface at an angle inclined to the bottom surface.

9. The radiating device according to claim 8, comprising a plurality of said heat pipe columns.

10. The radiating device according to claim 9, comprising a plurality of non-coplanar top surface portions, each inclined at an angle to the bottom surface and arranged in a stepped manner relative to each other.

11. The radiating device according to claim 8, further comprising a plurality of fins arranged on a free end of said column.

12. The radiating device according to claim 11, wherein each fin of said plurality of fins is arranged to extend on a respective plane substantially perpendicular to a direction of said extending of said column.

13. The radiating device of claim 8, wherein said heat pipe column defines an enclosed space and said heat pipe column contains a working fluid of about 15% to about 18% of the volume of said enclosed space.

* * * * *